US012573274B1

(12) United States Patent　　　　　(10) Patent No.: US 12,573,274 B1
Yan　　　　　　　　　　　　　　　　　(45) Date of Patent:　　Mar. 10, 2026

(54) CONTROL METHOD FOR WIRELESS RF CLOCK OSCILLATOR

(71) Applicant: Jianhui Yan, Pingxiang (CN)

(72) Inventor: Jianhui Yan, Pingxiang (CN)

( * ) Notice: Subject to any disclaimer, the term of this patent is extended or adjusted under 35 U.S.C. 154(b) by 0 days.

(21) Appl. No.: 19/374,124

(22) Filed: Oct. 30, 2025

(51) Int. Cl.
　　*H04B 3/36*　　　(2006.01)
　　*G08B 6/00*　　　(2006.01)
　　*H03B 5/36*　　　(2006.01)
(52) U.S. Cl.
　　CPC　*G08B 6/00* (2013.01); *H03B 5/36* (2013.01)
(58) Field of Classification Search
　　CPC ................................... G08B 6/00; H03B 5/36
　　USPC ...................................................... 340/407.1
　　See application file for complete search history.

(56) References Cited

U.S. PATENT DOCUMENTS

2014/0204718 A1 * 7/2014 Heinberg ............... G04G 21/04
　　　　　　　　　　　　　　　　　　　　　368/47
2022/0011725 A1 * 1/2022 Chladek ............... G04G 21/025

FOREIGN PATENT DOCUMENTS

CN　　　　106998390　　*　8/2017　.......... H04L 67/025

* cited by examiner

*Primary Examiner* — Tai T Nguyen
(74) *Attorney, Agent, or Firm* — Birchwood IP

(57)　　　　　　　ABSTRACT

A control method for a wireless RF clock oscillator is provided, which includes a clock host and an independently set vibration unit. The clock host and the vibration unit communicate through an RF signal. The wireless communication between the clock host and the vibration unit avoids a risk of cable entanglement, pulling and damage. Besides that, a mechanism is continuously sent a control signal for a pre-set time. When the clock host sends alarm start or stop signal, an RF transmitting module will send a corresponding signal in a loop for the preset time and then stop it, instead of sending it one time, in coordination with a standby mode of the vibration unit. This ensures that the vibration unit can accurately start to vibrate when the alarm starts, and stop vibrating in a timely manner when the alarm ends, ensuring the reliability of the reminder function.

10 Claims, 3 Drawing Sheets

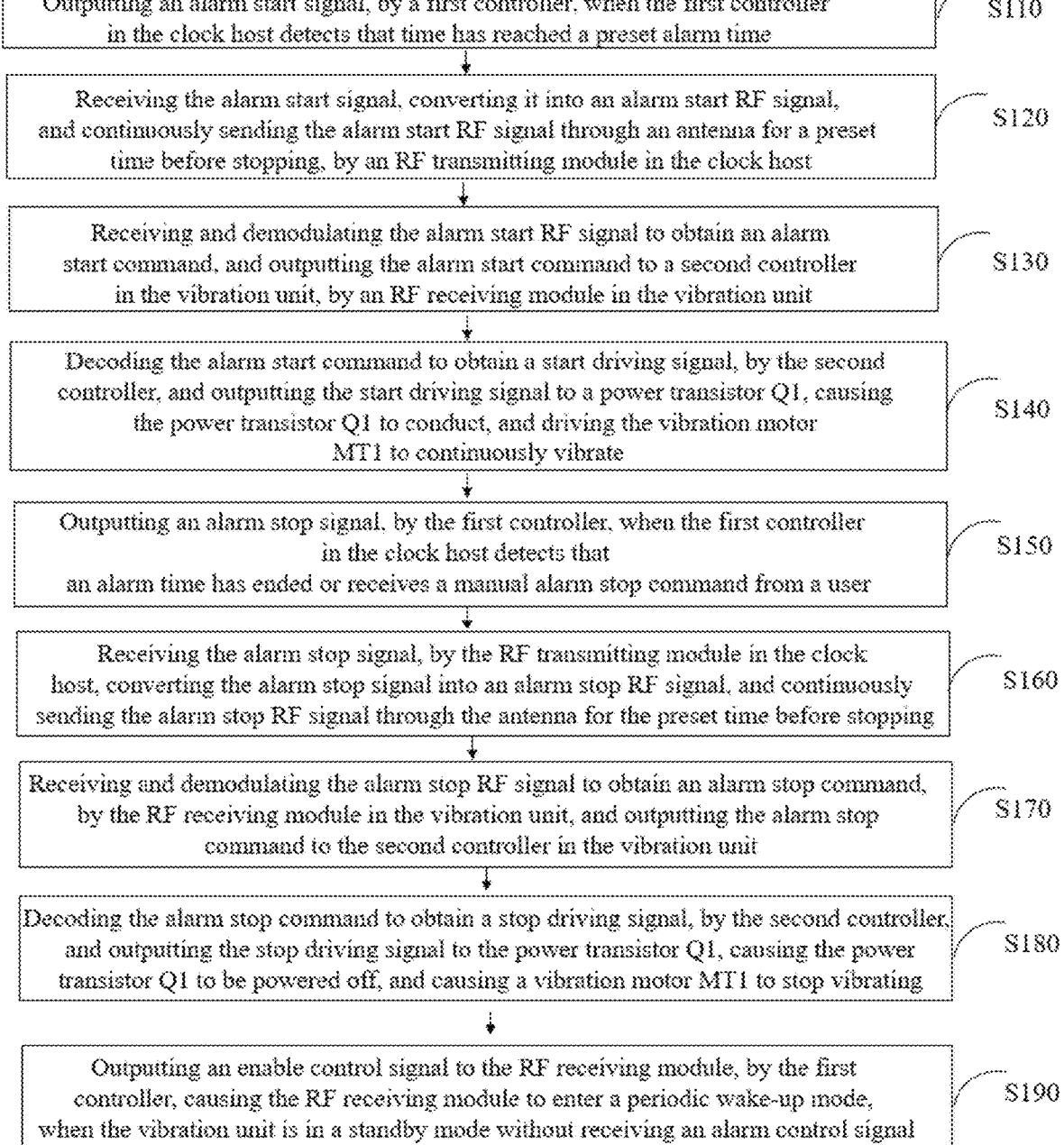

Outputting an alarm start signal, by a first controller, when the first controller in the clock host detects that time has reached a preset alarm time — S110

Receiving the alarm start signal, converting it into an alarm start RF signal, and continuously sending the alarm start RF signal through an antenna for a preset time before stopping, by an RF transmitting module in the clock host — S120

Receiving and demodulating the alarm start RF signal to obtain an alarm start command, and outputting the alarm start command to a second controller in the vibration unit, by an RF receiving module in the vibration unit — S130

Decoding the alarm start command to obtain a start driving signal, by the second controller, and outputting the start driving signal to a power transistor Q1, causing the power transistor Q1 to conduct, and driving the vibration motor MT1 to continuously vibrate — S140

Outputting an alarm stop signal, by the first controller, when the first controller in the clock host detects that an alarm time has ended or receives a manual alarm stop command from a user — S150

Receiving the alarm stop signal, by the RF transmitting module in the clock host, converting the alarm stop signal into an alarm stop RF signal, and continuously sending the alarm stop RF signal through the antenna for the preset time before stopping — S160

Receiving and demodulating the alarm stop RF signal to obtain an alarm stop command, by the RF receiving module in the vibration unit, and outputting the alarm stop command to the second controller in the vibration unit — S170

Decoding the alarm stop command to obtain a stop driving signal, by the second controller, and outputting the stop driving signal to the power transistor Q1, causing the power transistor Q1 to be powered off, and causing a vibration motor MT1 to stop vibrating — S180

Outputting an enable control signal to the RF receiving module, by the first controller, causing the RF receiving module to enter a periodic wake-up mode, when the vibration unit is in a standby mode without receiving an alarm control signal — S190

FIG. 1

CONTROL METHOD FOR WIRELESS RF CLOCK OSCILLATOR

TECHNICAL FIELD

The present disclosure relates to the field of RF clock oscillator technologies, and in particular, to a control method for a wireless RF clock oscillator.

BACKGROUND

In daily life and work scenarios, clock products are widely used as timing and time management tools, and alarm clock or timed reminder function is one of its core applications, which can help a user accurately controls time nodes and meet diverse needs such as waking up, meetings, task switching, etc. At present, clock products on the market mainly achieve reminder functions through three modes after the alarm clock or scheduled time arrives, namely sound reminders, flash reminders, and vibration reminders.

Sound reminders rely on the propagation of sound waves to transmit information, but they are easily disturbed in noisy environments, leading to the failure of reminders, and in scenes that require quietness (such as libraries, collective dormitories during nighttime rest periods), they can cause interference to surrounding people. Flash reminders attract users' attention through changes in lighting, but the reminder effect is not good for visually impaired people or users in strong lighting environments. In contrast, vibration reminders can provide the users with accurate and low interference reminder services without generating noise or being affected by lighting environments, by directly applying physical vibrations to the carriers that users encounter (such as desktops, headboards) or the users themselves (such as wearable devices). Therefore, in scenes that are sensitive to noise, have complex lighting conditions, or require consideration of the needs of special populations, vibration reminders have irreplaceable advantages.

At present, the application of vibration reminder methods in clock products can be mainly divided into two categories: a first category is to directly integrate a vibration unit into a clock host, and power supply and control of the vibration unit are directly implemented by the clock host. In this way, the vibration unit and the clock host form an integrated structure, and the vibration signal can be directly transmitted to a placement carrier through the clock host, and then perceived by the user. A second type is to physically separate the vibration unit from the clock host. The vibration unit is connected to the clock host through a cable, and the power required for its operation and the control signal for responding to timing reminders are obtained from the clock host through the cable. This method provides flexibility for the placement of the vibration unit to a certain extent, rendering it closer to the user (such as being placed next to a pillow) and improving the perception effect of reminders.

However, the two vibration control methods have obvious shortcomings in practical applications, rendering it difficult to meet user's needs for convenience and user experience. Specifically, the core principle of vibration reminders is to transmit information through physical vibration. A propagation distance of the vibration signal is limited by the amplitude of the vibration source and the propagation medium, and cannot be transmitted over long distances like sound signals (which can propagate over long distances through air) or flash signals (which can propagate in straight lines through light). Therefore, to ensure that the users can effectively perceive vibration reminders, clock products with vibration functions need to be placed close to the users. For the method of integrating the vibration unit inside the clock host, the volume of the clock host is usually large (to accommodate timing modules, display modules, power supply modules, etc.), rendering it inconvenient to carry. Users find it difficult to keep it by their side at all times during movement, resulting in a significant reduction in the effectiveness of vibration reminders in non-fixed scenarios (such as hotel rooms or temporary office areas during business trips). For the method of connecting the vibration unit to the clock host through a cable, the length of the cable directly limits the maximum distance between the vibration unit and the clock host. Usually, the cable length is only 0.5-2 meters, which cannot meet the user's needs of placing the clock host in a distant position (such as the living room) and the vibration unit next to it (such as the bedside of the bedroom). In daily use, the cable is prone to entanglement and knotting, which not only affects the convenience of use, but also may cause damage to the cable due to pulling, thereby shortening the service life of the product. Besides that, the size limitation of the clock host makes it difficult to carry, further reducing the applicability of the product in mobile scenarios.

In summary, the vibration reminder schemes of existing clock products have shortcomings in terms of flexibility, portability, and reliability, rendering it difficult to meet the diverse usage needs of users. There is an urgent need for a vibration reminder control scheme that can break through space limitations, improve usability, and ensure reminder effectiveness to address the shortcomings of existing technology.

SUMMARY

The purpose of the present disclosure is to overcome shortcomings of the prior art and provide a control method for a wireless RF clock oscillator.

In order to solve the above technical problems, the present disclosure adopts the following technical solution.

An embodiment of the present disclosure provides a control method for a wireless RF clock oscillator, including: a clock host and an independently set vibration unit; the clock host and the vibration unit communicate through an RF signal, the vibration unit is powered by an independent battery, where the method includes following steps of:

outputting an alarm start signal, by a first controller, when the first controller in the clock host detects that time has reached a preset alarm time;

receiving the alarm start signal, converting it into an alarm start RF signal, and continuously sending the alarm start RF signal through an antenna for a preset time before stopping, by an RF transmitting module in the clock host;

receiving and demodulating the alarm start RF signal to obtain an alarm start command, and outputting the alarm start command to a second controller in the vibration unit, by an RF receiving module in the vibration unit;

decoding the alarm start command to obtain a start driving signal, by the second controller, and outputting the start driving signal to a power transistor Q1, causing the power transistor Q1 to conduct, and driving the vibration motor MT1 to continuously vibrate;

outputting an alarm stop signal, by the first controller, when the first controller in the clock host detects that an alarm time has ended or receives a manual alarm stop command from a user;

receiving the alarm stop signal, by the RF transmitting module in the clock host, converting the alarm stop signal into an alarm stop RF signal, and continuously sending the alarm stop RF signal through the antenna for the preset time before stopping;

receiving and demodulating the alarm stop RF signal to obtain an alarm stop command, by the RF receiving module in the vibration unit, and outputting the alarm stop command to the second controller in the vibration unit;

decoding the alarm stop command to obtain a stop driving signal, by the second controller, and outputting the stop driving signal to the power transistor Q1, causing the power transistor Q1 to be powered off, and causing a vibration motor MT1 to stop vibrating;

outputting an enable control signal to the RF receiving module, by the first controller, causing the RF receiving module to enter a periodic wake-up mode, when the vibration unit is in a standby mode without receiving an alarm control signal.

The beneficial effect of the control method of the wireless RF clock oscillator of the present disclosure compared to the prior art is that wireless communication between the clock host and the independent vibration unit is achieved through the RF signal, which eliminates the connection method of physical cables. On the one hand, the vibration unit can be separated from a spatial limitation of the clock host. Users can place the vibration unit in a location close to themselves according to their actual needs (such as next to a pillow or in a pocket), and the clock host can be placed in any convenient area for operation or placement (such as the living room desktop or bedroom dressing table), without being limited by a constraint of "the vibration unit and the host need to be placed close to each other or within a range of cable length", effectively solving a problem of "short transmission distance of vibration signals requiring the host to be close to the user". On the other hand, wireless communication design avoids a risk of cable entanglement, pulling and damage, reducing operational interference in daily use. At the same time, the vibration unit can be designed to be smaller and lighter in size because it does not require integrated timing, display and other modules, thereby greatly improving portability and adapting to the needs of mobile scenarios such as business trips and travel, improving the user experience. Furthermore, considering the possible signal leakage and reception problems in wireless communication (such as environmental interference and signal transmission delay), a mechanism is designed to continuously transmit a control signal for the preset time. When the clock host sends alarm start or stop signals, the RF transmitting module will cycle and send the corresponding signal for the preset time before stopping, instead of sending it one time. This design is coordinated with the standby mode of the vibration unit. Even if the vibration unit is in a periodic wake-up state (not continuously receiving signals), during the signal transmission cycle in the pre-set time, the RF reception module of the vibration unit can capture the signal through multiple wake-up windows, avoiding control failure caused by "mismatch between the receiving window and a signal transmission time", ensuring that the vibration unit can accurately start vibration when the alarm starts and stop vibration in a timely manner when the alarm ends, ensuring the reliability of the reminder function, and avoiding the problems of "no vibration when the reminder is needed" and "continuous vibration when it needs to be stopped". Furthermore, the second controller outputs the enable signal to control the RF receiving module to enter the periodic wake-up mode, achieving an ultimate optimization of power consumption. In the standby mode, the RF receiving module does not work continuously, but operates according to a periodic pattern. When in sleeping mode, the module consumes low power, greatly reducing the frequency of battery replacement or charging for users, lowering usage costs and operational difficulties, and reducing environmental resource consumption caused by battery replacement, thereby balancing practicality and environmental friendliness.

The present disclosure will be further described in combination with the accompanying drawings and specific embodiments.

BRIEF DESCRIPTION OF DRAWINGS

FIG. 1 is a flowchart of a control method for a wireless RF clock oscillator provided in an embodiment of the present disclosure.

DESCRIPTION OF EMBODIMENTS

Figure 2:
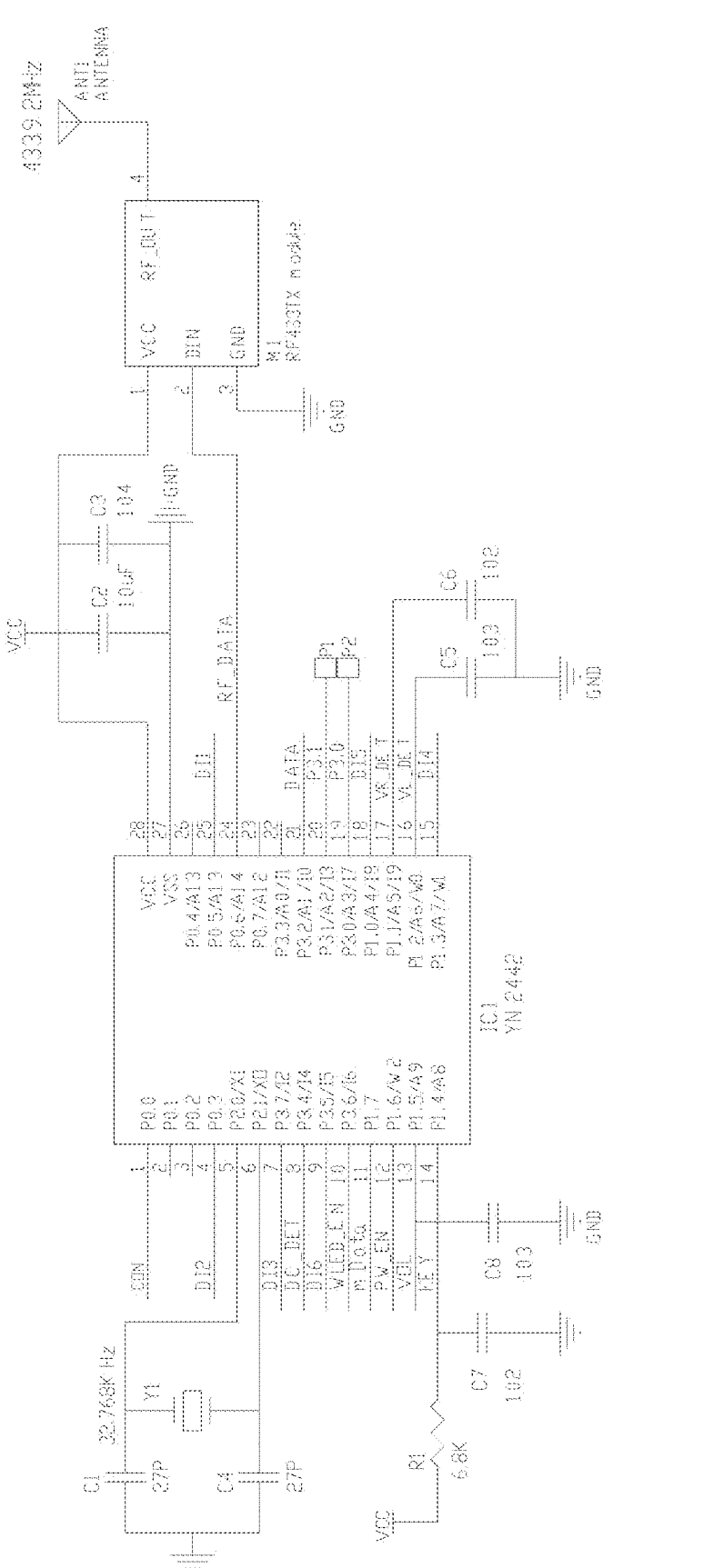
FIG. 2 is a schematic circuit diagram of a clock host provided by the present disclosure.
Figure 3:
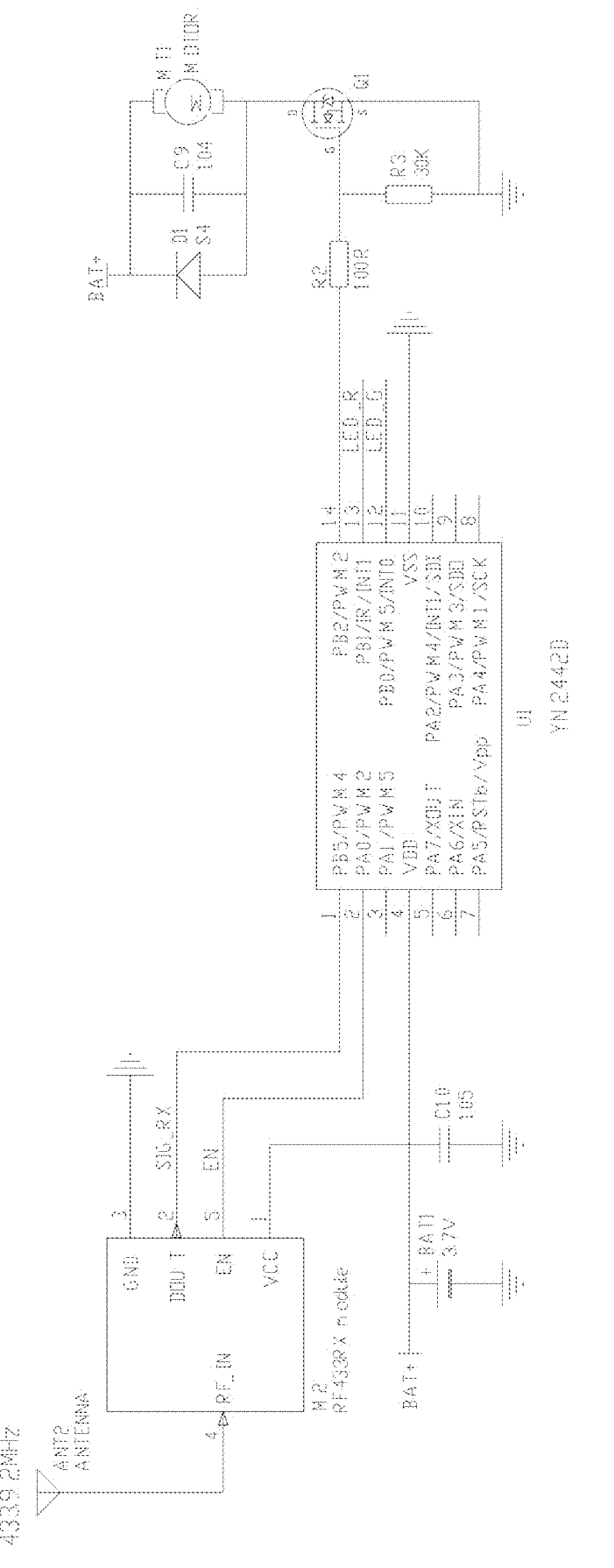
FIG. 3 is a schematic circuit diagram of a vibration unit provided by the present disclosure.

Referring to the specific embodiments shown in FIGS. 1 to 3, the present disclosure discloses a control method for a wireless RF clock vibrator, including a clock host and an independently set vibration unit, the clock host and the vibration unit communicate through a radio frequency, (RF) signal, and the vibration unit is powered by an independent battery, and the method includes the following steps:

S110: outputting an alarm start signal, by a first controller, when the first controller in the clock host detects that time has reached a preset alarm time;

S120: receiving the alarm start signal, converting it into an alarm start RF signal, and continuously sending the alarm start RF signal through an antenna for a preset time before stopping, by an RF transmitting module in the clock host;

S130: receiving and demodulating the alarm start RF signal to obtain an alarm start command, and outputting the alarm start command to a second controller in the vibration unit, by an RF receiving module in the vibration unit;

S140: decoding the alarm start command to obtain a start driving signal, by the second controller, and outputting the start driving signal to a power transistor Q1, causing the power transistor Q1 to conduct, and driving the vibration motor MT1 to continuously vibrate;

S150: outputting an alarm stop signal, by the first controller, when the first controller in the clock host detects that an alarm time has ended or receives a manual alarm stop command from a user;

S160: receiving the alarm stop signal, by the RF transmitting module in the clock host, converting the alarm stop signal into an alarm stop RF signal, and continuously sending the alarm stop RF signal through the antenna for the preset time before stopping;

S170: receiving and demodulating the alarm stop RF signal to obtain an alarm stop command, by the RF receiving module in the vibration unit, and outputting the alarm stop command to the second controller in the vibration unit;

S180: decoding the alarm stop command to obtain a stop driving signal, by the second controller, and outputting the stop driving signal to the power transistor Q1, causing the power transistor Q1 to be powered off, and causing a vibration motor MT1 to stop vibrating;

S190: outputting an enable control signal to the RF receiving module, by the first controller, causing the RF receiving module to enter a periodic wake-up mode, when the vibration unit is in a standby mode without receiving an alarm control signal.

In an implementation mode, hardware configuration of the clock host is as follows.

The first controller (IC1): a YN2442 MCU (microcontroller unit) is selected, which integrates timing, signal output, and logic judgment functions. Its 24th pin (RF_DATA pin) is used as a control signal output terminal to transmit the alarm start/stop signal. At the same time, the IC1 is externally connected to a 32.768 KHz crystal oscillator module (including a crystal oscillator element Y1) to provide a stable clock reference for IC1, ensuring timing accuracy and meeting detection requirements of "pre-set alarm time".

The RF transmitting module (M1): a RF433TX module model RF transmitting module is used, its signal input terminal is connected to the 24th pin (RF_DATA pin) of the first controller to receive an electrical signal output by the controller. An output terminal thereof is connected to an ANT1 antenna (a 433.92 MHz dedicated antenna), which is configured to convert the electrical signal into the RF signal and transmit it externally. The module is powered by a VCC pin of the clock host to ensure stable operation.

An auxiliary circuit: equipped with 10 uF capacitor (C1), 0.1 μF capacitor (corresponding to a capacitor value of C2, 104 model), 27 pF capacitor (C4, C8) and other components. Where C1 is used for power filtering; C2, C4, and C8 are used for signal stabilization to jointly avoid signal transmission abnormalities caused by circuit interference.

Hardware configuration of the vibration unit is as follows.

Independent power supply component: a 1000 mAh rechargeable lithium battery (BAT1) is used to provide overall power to the vibration unit, without relying on the clock host or external power source, ensuring independence and portability.

The second controller (U1): a YN2442D MCU model is selected, its $1^{st}$ pin (SIG_RX) of the second controller is used as a signal receiving terminal, connected to a signal output terminal of the RF receiving module; a $2^{nd}$ pin (EN) thereof serves as an enable control terminal, connected to a $5^{th}$ pin of the RF receiving module, for outputting sleep/wake-up control signals; a $14^{th}$ pin thereof serves as a driving signal output terminal, connected to a ground, (G) electrode of the power transistor Q1 through a resistor R2, to achieve on/off control of the power transistor.

The RF receiving module (M2): a 433.92 MHz RF receiving module that matches the RF transmitting module is selected, and its signal input terminal is connected to an ANT2 receiving antenna to capture the RF signal sent by the clock host. A signal output terminal (DOUT pin, a $2^{nd}$ pin) is connected to a $1^{st}$ pin of the second controller to transmit a demodulated electrical signal to the controller. An enable terminal ($5^{th}$ pin) thereof receives a signal output from a $2^{nd}$ pin of the second controller to switch between working/sleeping states.

Vibration driving component: Negative-Positive-Negative, (NPN) power transistor Q1 (such as SS8050) is used, a G electrode of the NPN power transistor Q1 receives the driving signal from the second controller, a source, (S) electrode thereof is grounded, a drain, (D) electrode thereof is connected to one end of the vibration motor MT1, and the other end of the vibration motor MT1 is connected to a positive electrode of the battery (BAT1+). When the power transistor Q1 is conducted, a current is formed in a motor circuit, the vibration motor MT1 is driven to vibrate. When the power transistor Q1 is cut off, the circuit is disconnected and the vibration motor MT1 stops vibrating.

A control process for starting the alarm is as follows.

The first controller (IC1) detects an internal timing module in real time. When the time reaches the user's pre-set alarm time (such as 7:00 am), its internal logic judgment unit triggers the "alarm start" command, and outputs a high-level electrical signal (alarm start signal) through the $24^{th}$ pin (RF_DATA).

After receiving the electrical signal, the RF transmitting module (M1) converts it into a 433.92 MHz alarm start RF signal through an internal modulation circuit, and then sends the alarm start RF signal wirelessly to the outside through the ANT1 antenna. According to a preset program, the RF signal is continuously transmitted for 40 seconds in a loop, with an interval of 1 second per transmission. After 40 seconds, the module stops transmitting and enters a low-power consumption state.

If the RF receiving module (M2) of the vibration unit is in the wake-up state (working window in periodic wake-up mode), it captures the alarm start RF signal through the ANT2 antenna, restores the RF signal to the electrical signal (alarm start command) through the internal demodulation circuit, and outputs it from the $2^{nd}$ pin (DOUT) to the $1^{st}$ pin (SIG_RX) of the second controller (U1).

The second controller (U1) decodes the received alarm start command (verifying whether a signal format matches and avoiding false triggering of interference signals), confirms it is correct, and outputs a high-level start driving signal through a $14^{th}$ pin. The signal is limited by the resistor R2 and transmitted to the G electrode of the power transistor Q1. After the G electrode of the power transistor Q1 reaches a high level, it conducts, and a voltage difference is formed between two ends of the vibration motor MT1 (BAT1+ to the D electrode of the power transistor Q1, S electrode to BAT1−). The vibration motor MT1 starts and continues to vibrate until it receives the alarm stop signal.

A control process for stopping the alarm is as follows.

When the first controller (IC1) detects that the alarm time has ended (a pre-set alarm duration is 10 minutes, i.e. 7:10), or when the user presses a "stop alarm" button on the clock host (manual stop command), its internal logic unit triggers the "alarm stop" command and outputs a low-level electrical signal (alarm stop signal) through the $24^{th}$ pin (RF_DATA).

After receiving the low-level signal, the RF transmitting module (M1) converts the low-level signal into a 433.92 MHz alarm stop RF signal, which is also continuously transmitted for 40 seconds through the ANT1 antenna in a loop, following the same transmission rules as the alarm start signal.

The RF receiving module (M2) of the vibration unit captures the alarm stop RF signal, demodulates it into the alarm stop command, and transmits the alarm stop command to the second controller (U1); after U1 decoding and confirming, an output signal of the $14^{th}$ pin is switched to a low level (stop driving signal).

After the G electrode of the power transistor Q1 loses the high-level signal and shuts off, a power supply circuit of the vibration motor MT1 is disconnected, the motor stops vibrating, and the vibration unit returns to the standby mode.

A control process for waking up a standby cycle of the vibration unit is as follows.

When the vibration unit does not receive any alarm control signal (i.e. non alarm state), the second controller (U1) automatically triggers the standby mode and outputs periodic high and low level signals through the $2^{nd}$ pin (EN): every 8 seconds is a cycle, with a first 200 milliseconds (0.2 seconds) outputting a high level (enable signal) and a last 7.8 seconds outputting a low level (sleeping signal).

The $5^{th}$ pin of the RF receiving module (M2) receives this signal: when receiving the high level, the module starts and enters a working state (consuming about 5 mA of power), which can capture an external RF signal. When receiving the low level, the module shuts down most of the circuits and only retains a wake-up detection unit (which consumes about 0.1 uA) to achieve sleeping. Through this periodic wake-up mode, the average power consumption of the RF receiving module in one cycle is reduced to $\frac{1}{40}$ of a continuous operation mode ((5 mA×0.2 s+0.1 uA×7.8 s)/8 s≈0.125 mA).

That is, wireless communication between the clock host and the independent vibration unit is achieved through the RF signal, which eliminates the connection method of physical cables. On the one hand, the vibration unit can be separated from the spatial limitations of the clock host. Users can place the vibration unit in a location close to themselves according to their actual needs (such as next to a pillow or in a pocket), and the clock host can be placed in any convenient area for operation or placement (such as the living room desktop or bedroom dressing table), without being limited by the constraint of "the vibration unit and the host need to be placed close to each other or within the range of cable length", effectively solving the problem of "short transmission distance of vibration signals requiring the host to be close to the user". On the other hand, wireless communication design avoids the risk of cable entanglement, pulling and damage, reducing operational interference in daily use. At the same time, the vibration unit can be designed to be smaller and lighter in size because it does not require integrated timing, display and other modules, thereby greatly improving portability and adapting to the needs of mobile scenarios such as business trips and travel, improving the user experience. Furthermore, considering the possible signal leakage and reception problems in wireless communication (such as environmental interference and signal transmission delay), a mechanism is designed to continuously transmit the control signal for the preset time. When the clock host sends alarm start or stop signals, the RF transmitting module will cycle and send the corresponding signal for the preset time before stopping, instead of sending it one time. This design is coordinated with the standby mode of the vibration unit. Even if the vibration unit is in a periodic wake-up state (not continuously receiving signals), during the signal transmission cycle in the pre-set time, the RF reception module of the vibration unit can capture the signal through multiple wake-up windows, avoiding control failure caused by "mismatch between the receiving window and the signal transmission time", ensuring that the vibration unit can accurately start vibration when the alarm starts and stop vibration in a timely manner when the alarm ends, ensuring the reliability of the reminder function, and avoiding the problems of "no vibration when the reminder is needed" and "continuous vibration when it needs to be stopped". Furthermore, the second controller outputs the enable signal to control the RF receiving module to enter the periodic wake-up mode, achieving the ultimate optimization of power consumption. In standby mode, the RF receiving module does not work continuously, but operates according to a periodic pattern that wakes up for only 200 milliseconds within an 8-second periodic. The module consumes only about 0.1 uA during sleeping and about 5 mA during operation, and the average power consumption during the entire cycle is only $\frac{1}{40}$ of that in continuous operation mode. Taking a 1000 mAh battery as an example, the existing solution has a battery life of about 200 hours. This solution can extend the battery life to about 8000 hours (about 333 days), significantly reducing the frequency of battery replacement or charging for users, lowering usage costs and operational difficulties, while reducing environmental resource consumption caused by battery replacement, balancing practicality and environmental friendliness. Besides that, the control process of this scheme follows a logical chain of "clock host triggering-signal wireless transmission-vibration unit response-standby power optimization", with each step closely executed and implemented based on mature hardware modules (MCU controller, RF transmission/receiving module, power transistor, vibration motor), without relying on special customized components. Where the first controller (IC1) of the clock host outputs the control signal through the RF_DATA pin, and the second controller of the vibration unit controls the wake-up of the receiving module through the $2^{nd}$ pin (EN) pin, with strong hardware compatibility and controllable production costs. Compared to complex innovative hardware designs, this solution not only achieves technological breakthroughs, but also has the advantages of low development difficulty and high mass production, rendering it easy to quickly transform into actual products and meeting the market's demand for "wireless, power-saving, and reliable" clock vibration reminder products.

As shown in FIG. 2, in an embodiment, the clock host includes the first controller IC1, an RF transmitting module, and a crystal oscillator module. The RF transmitting module and the crystal oscillator module are electrically connected to the first controller IC1.

In an implementation mode, the first controller IC1 uses a YN2442 microcontroller unit (MCU), which is a twenty-eighth pin package with core functions such as timing management, signal output, and logic judgment. It also supports a low-power consumption mode and is suitable for the "long-term standby+precise control" needs of clock products. Its $24^{th}$ pin is defined as a RF_DATA pin, which serves as the control signal output terminal and is directly connected to the signal input terminal of the RF transmitting module, 20 (P3.1/A2/13), 21 (Direct Current, (DC), Detailed Electrical Test, (DET)) and other pins assist in power detection and external command reception (such as user manual stop alarm button signal by a user). A VCC pin (such as $2^{nd}$, $12^{th}$) is connected to a power supply circuit of the clock host (usually a 3.3V or 5V DC power supply), and a VSS pin (such as $6^{th}$, $19^{th}$) is grounded to ensure stable power supply to the chip.

The RF transmitting module uses a RF433TX module model RF transmitting module (M1), which supports a 433.92 MHz wireless frequency band, has signal modulation and RF transmission functions, and is compact in size with low power consumption, suitable for the integration requirements of the clock host. The "DATA" signal input terminal of the module is directly electrically connected to a $24^{th}$ pin (RF_DATA) of the first controller IC1, configured to receive the alarm start/stop electrical signal output by IC1. The "VCC" pin of the module is connected to the power supply circuit of the clock host and the VCC pin of IC1 to obtain working power. The "RF OUT" pin of the module is connected to the ANT1 antenna (433.92 MHz ANTENNA) for transmitting modulated RF signal to the outside. The Ground, "(GND)" pin of the module is grounded with the VSS pin of IC1 to ensure signal transmission without interference.

The crystal oscillator module uses a 32.768 KHz quartz crystal oscillator (Y1), this frequence is a standard timing frequency of clock products. It has the characteristics of high accuracy (error≤±10 ppm) and strong stability (less affected by temperature/voltage fluctuations), and can meet precise detection requirements of "pre-set alarm time". Two signal output terminals of the crystal oscillator module are respectively electrically connected to $5^{th}$ pin and $6^{th}$ pin of the first controller IC1, providing a stable clock reference signal for IC1. At the same time, parallel capacitors are connected at the two ends of the crystal oscillator module. One end of the capacitor is connected to the crystal oscillator pin, and the other end thereof is grounded to stabilize the crystal oscillator frequency and avoid timing deviation caused by external electromagnetic interference.

After the crystal oscillator module is powered on, it generates a stable clock signal through high-frequency oscillation of 32.768 KHz, which is continuously transmitted to $5^{th}$ pin and $6^{th}$ pin of the first controller IC1. A timing unit in IC1 counts based on the clock signal and converts it into actual time in hours/minutes/seconds, achieving the functions of "real-time timing" and "pre-set alarm time storage"—for example, if the user sets the alarm at 7:00 in the morning. IC1 will convert the time into a counting threshold of the crystal oscillator signal and compare the current count value with the threshold in real time. When the timing unit of IC1 detects that the current count value reaches the threshold corresponding to the alarm time (or receives a button signal of a manual stop alarm by the user), its internal logic judgment unit triggers the corresponding instruction: if it is "alarm start", it outputs a high-level electrical signal through the $24^{th}$ pin (RF_DATA pin). If it is "alarm stop", a low-level electrical signal will be output, and the low-level electrical signal will be directly transmitted to the RF transmitting module as the core control signal. After receiving the electrical signal output by IC1, the RF transmitting module converts the electrical signal into a 433.92 MHz RF signal through the internal modulation circuit (such as amplitude-shift keying, (ASK) modulation), and continuously sends the RF signal in a loop for 40 seconds (to ensure that the vibration unit can capture the signal). During a transmission process, the crystal oscillator module continuously provides a clock signal to IC1 to ensure that the IC1 can accurately control a transmission time (after 40 seconds, a stop signal is output through the RF_DATA pin to cause the RF transmitting module to stop transmitting).

As shown in FIG. 2, in an embodiment, the crystal oscillator module includes the crystal oscillator element Y1, a capacitor C1, and a capacitor C4. A $1^{st}$ pin of the crystal oscillator element Y1 is connected to the capacitor C1 and a $5^{th}$ pin of the first controller IC1, and a $2^{nd}$ pin of the crystal oscillator element Y1 is connected to the capacitor C4 and a $6^{th}$ pin of the first controller IC1.

In an implementation mode, the crystal oscillator component Y1 uses a two-pins direct insertion package, a $1^{st}$ pin as a clock signal output terminal (OUT) and a $2^{nd}$ pin as a clock signal input terminal (IN), without polarity distinction, and only needs to be connected in the order of the pins. Both capacitor C1 and capacitor C4 are made of multi-layer ceramic capacitors (MLCC) with a capacitance of 27P and a withstand voltage value of ≥6.3V (suitable for power supply voltage of 3.3V/5V for the clock host to avoid breakdown damage). This type of capacitor has advantages of small size and good high-frequency characteristics (can stably filter RF interference). As a load capacitor of the crystal oscillator element Y1, it is used to stabilize the oscillation frequency of Y1, offset a parasitic capacitance between Y1 and the first controller IC1, and ensure the purity of the output clock signal.

After the clock host is powered on, the $5^{th}$ pin of the first controller IC1 outputs an excitation signal to the $1^{st}$ pin of the crystal oscillator element Y1. Y1 starts a mechanical oscillation of 32.768 KHz under the action of the excitation signal, and the oscillation signal is fed back to a $6^{th}$ pin of IC1 through the $2^{nd}$ pin. Capacitors C1 and C4 act as load capacitors, forming an "oscillation loop" with the internal capacitance of Y1 to counteract the influence of a parasitic capacitance on the circuit (such as PCB circuit capacitance and IC pin capacitance), ensuring that the actual oscillation frequency of Y1 is accurately stabilized at 32.768 KHz and avoiding timing bias caused by frequency offset. The stable 32.768 KHz oscillation signal is transmitted from a $1^{st}$ pin of Y1 to the $5^{th}$ pin of IC1. The timing unit in IC1 divides and counts the signal (for example, dividing the 32.768 KHz signal into 1 Hz signal, counting once per second), and finally converts it into the actual time of "hour/minute/second", providing an accurate time reference for IC1 to detect the "pre-set alarm time".

As shown in FIG. 2, in an embodiment, the RF transmitting module includes a transmitting module M1, a $2^{nd}$ pin of the transmitting module M1 is connected to the $24^{th}$ pin of the first controller IC1, and a $4^{th}$ pin of the transmitting module M1 is connected to the antenna.

In an implementation mode, the $2^{nd}$ pin of the transmitting module M1 is defined as a signal input terminal, configured to receive the alarm control signal (alarm start/stop signal) output by the first controller IC1. The $24^{th}$ pin of the first controller IC1 is defined as a RF_DATA pin, which is a dedicated pin for IC1 to output the wireless control signal. The two are directly connected through PCB wires. Because the signal input level of M1 (3.3V/5V) perfectly matches the output level of the $24^{th}$ pin of the IC1, there is no need to connect a resistor in series to limit current or a level conversion chip, and direct connection can ensure signal transmission without distortion—when IC1 detects that the alarm time has arrived, the $24^{th}$ pin outputs a high level (alarm start signal). When detecting the alarm is ending or a manual stop command, the $24^{th}$ pin outputs a low level (alarm stop signal), and the $2^{nd}$ pin of M1 can directly recognize a level change.

A $4^{th}$ pin of the transmitting module M1 is defined as a RF signal output terminal (RF OUT pin), which is configured to output the modulated 433.92 MHz RF signal. The connected antenna uses a 433.92 MHz dedicated whip antenna or a PCB built-in antenna. If it is an external whip antenna, it is connected to the $4^{th}$ pin of M1 through an IPEX connector. If it is a built-in PCB antenna, it can be directly integrated with the $4^{th}$ pin of M1 through the PCB microstrip lines. The $1^{st}$ pin (VCC pin) of M1 is connected to a 3.3V power supply circuit of the clock host and a $28^{th}$ pin (VCC pin) of IC1 to obtain a stable working power supply. A $3^{rd}$ pin (GND pin) of the M1 and a VSS pin ($27^{th}$ pin) of the IC1 are grounded together with a ground plane of the clock host, thereby forming a unified grounding reference to avoid signal interference caused by a ground potential difference.

When the $24^{th}$ pin of the IC1 outputs a high level (alarm start signal) or a low level (alarm stop signal), a $2^{nd}$ pin of the M1 receives the digital level signal, and the internal modulation circuit (using ASK amplitude-shift keying) converts the level signal into a 433.92 MHz RF signal—high level corresponds to "RF signal continuous output", low level corresponds to "RF signal intermittent output", ensuring that the signal carries control command information. The modulated RF signal is transmitted to the antenna through the $4^{th}$ pin of the M1 and radiated into the air through the antenna. The signal needs to be continuously sent in a loop for 40 seconds, with a transmission cycle of 1 second per time (i.e. sending an RF signal once per second for 40 seconds). The transmission duration is controlled by IC1 ($24^{th}$ pin of the IC1 continuously output high/low levels for 40 seconds, and M1 synchronously continues to send signals). After 40 seconds, the $24^{th}$ pin of the IC1 returns to a high impedance state, and M1 stops sending and enters the low power consumption state.

As shown in FIG. 2, in an embodiment, the clock host further includes a first filtering module, and the first filtering module includes a capacitor C2 and a capacitor C3. A $1^{st}$ pin of the capacitor C2 and a $1^{st}$ pin of the capacitor C3 are both connected to a $27^{th}$ pin of the first controller IC1, and a $2^{nd}$ pin of the capacitor C2 and a $2^{nd}$ pin of the capacitor C3 are both connected to the $28^{th}$ pin of the first controller IC1 and a $1^{st}$ pin of the transmitting module M1.

In an implementation mode, the $1^{st}$ pin of the capacitor C2 (a non-polar capacitor, any pin can be considered as the $1^{st}$ pin) and the $1^{st}$ pin of the capacitor C3 are connected to the $27^{th}$ pin of the first controller IC1. According to the pin function of IC1, the $27^{th}$ pin is the VCC auxiliary power supply pin, which is used to provide stable power for the RF signal processing unit or timing unit inside IC1, to avoid the load fluctuation of the main power supply pin affecting the operation of the unit. The $2^{nd}$ pin of the capacitor C2 and the $2^{nd}$ pin of the capacitor C3 are connected to two target pins: one is the $28^{th}$ pin of the first controller IC1. According to the pin definition of IC1, the $28^{th}$ pin is the power filter ground pin (VSS), which is connected to a main ground pin of IC1 to form a unified ground reference; a second is the first pin of the transmitting module M1. According to the pin definition of M1, the $1^{st}$ pin is the module power supply pin (VCC), which is connected to the main power supply circuit of the clock host to obtain working power.

The main power supply circuit of the clock host (3.3V/5V) simultaneously supplies power to the $27^{th}$ pin (VCC auxiliary) of IC1 and the $1^{st}$ pin (VCC) of M1. The power supply signal may carry two types of interference: low-frequency ripple (100 Hz-10 KHz) generated by other components in the main circuit (such as display module and button module) during operation, and high-frequency interference (433.92 MHz and its harmonic wave) generated by M1 itself when sending the RF signal. When the power supply signal flows through the common connection node 2 ($2^{nd}$ pins of C2 and C3), capacitor C2 (10 uF) forms a low impedance path for a low-frequency ripple, and a low-frequency interference signal is introduced into the grounding terminal through the $28^{th}$ pin (VSS) of IC1. The capacitor C3 (0.1 μF) forms a low impedance path against a high-frequency interference, introducing 433 MHz high-frequency noise and other high-frequency ripples generated by M1 into the grounding terminal, and finally outputting to the $27^{th}$ pin of the IC1 and the $1^{st}$ pin of the M1. The power supply signal only retains pure DC voltage.

As shown in FIG. 2, in an embodiment, the clock host further includes a second filtering module, and the second filtering module includes a resistor R1, a capacitor C7, and a capacitor C8. One end of the resistor R1 is connected to the power supply, the other end thereof is connected to the capacitor C7 and the $14^{th}$ pin of the first controller IC1, and the capacitor C8 is connected to a $13^{th}$ pin of the first controller IC1.

In an implementation mode, one end of the resistor R1 is directly connected to the 3.3V/5V main power supply of the clock host (shared with the VCC pin of IC1 and the VCC pin of M1 to ensure power supply consistency). The other end thereof serves as a common node, connecting two targets simultaneously: one is one end of the capacitor C7 (a non-polar capacitor, any end is acceptable), and the other is the $14^{th}$ pin of the first controller IC1. According to the YN2442 pin function, the $14^{th}$ pin of IC1 is a signal input pin (such as a button signal input, an external state detection input), which requires stable power or signal input to avoid interference and false detection. The other end of the capacitor C7 is directly connected to the ground plane (GND) of the clock host, is ground with the VSS pin of the IC1 and the GND pin of the M1, thereby forming an RC filtering circuit of "resistor R1-capacitor C7". One end is connected to the power supply, and the other end is grounded, thereby filtering the input signal or power supply of the $14^{th}$ pin of IC1. One end of the capacitor C8 is connected to the $13^{th}$ pin of the first controller IC1, and the other end thereof is directly connected to the ground plane (GND). According to the function of pin YN2442, the $13^{th}$ pin of IC1 is an auxiliary signal pin (such as analog signal input and reference voltage pin), which needs to be filtered separately to ensure signal purity. Therefore, the capacitor C8 adopts a "one end connected to IC1 pin, and one end being grounded" method to form a ground filtering path.

When the power supply of the clock host supplies power or transmits signals (such as the level signal when a button is pressed) to the $14^{th}$ pin of IC1 through the resistor R1, the medium and high frequency interference carried in the power supply or signal (such as 433 MHz harmonic wave generated by M1 when sending the RF signal and switch noise of other circuits) will flow through the "resistor R1-capacitor C7" circuit. The first resistor R1 limits the current of the interference signal, and the capacitor C7 presents a low impedance to the medium and high frequency interference. The interference signal is introduced into the ground through the grounding terminal, and only pure DC voltage or effective signal is allowed to be transmitted to the $14^{th}$ pin of IC1 to avoid interference that may cause IC1 to misjudge the signal (such as misidentifying interference as a button to press). If the $13^{th}$ pin of IC1 is the analog signal input or reference voltage pin, its signal is susceptible to high-frequency interference (such as 32.768 KHz harmonic wave and power ripple of the crystal oscillator module). The capacitor C8 is directly connected in parallel between $13^{th}$ pin of IC1 and ground, thereby forming a low impedance path for high-frequency interference and directly filtering out the interference signal to ensure that the signal amplitude and voltage value of the $13^{th}$ pin are stable within the detection threshold range of IC1. The 6.8K Ω resistance of the resistor R1 can limit the maximum current flowing into the $14^{th}$ pin of IC1 (if the power supply unexpectedly fluctuates to 5V, a maximum current I=U/R≈0.7 mA), which is much lower than the maximum allowable input current of pin (usually ≥10 mA), to prevent the $14^{th}$ pin of IC1 from burning out due to power short circuits, external signal abnormalities, etc., and to provide hardware protection.

As shown in FIG. 2, in an embodiment, the clock host further includes a third filtering module, and the third filtering module includes a capacitor C5 and a capacitor C6. A $1^{st}$ pin of the capacitor C5 is connected to a $16^{th}$ pin of the first controller IC1, and a $1^{st}$ pin of the capacitor C6 is connected to the $17^{th}$ pin of the first controller IC1. Both the $2^{nd}$ pin of the capacitor C5 and the $2^{nd}$ pin of the capacitor C6 are grounded.

In an implementation mode, the capacitor C5 is a non-polar ceramic capacitor, with one pin directly connected to the $16^{th}$ pin of the first controller IC1. According to the pin function definition of YN2442, the $16^{th}$ pin of IC1 is a signal input/output pin (such as external sensor signal reception, alarm mode control signal output), which requires a stable signal transmission environment. A $2^{nd}$ pin of the capacitor C5 is directly connected to the main ground plane (GND) of PCB of the clock host, and is grounded together with the VSS pin of IC1 and the GND pin of M1, thereby forming a ground filtering path of "$16^{th}$ pin of IC1 pin-capacitor C5-GND". The capacitor C6 is also a non-polar ceramic capacitor, with the $1^{st}$ pin directly connected to the $17^{th}$ pin of the first controller IC1. According to the pin function of YN2442, the $17^{th}$ pin of IC1 is an auxiliary power supply or reference voltage pin (such as providing stable local power supply for the internal signal processing unit of IC1), which is sensitive to voltage fluctuations. The $2^{nd}$ pin of the capacitor C6 and the $2^{nd}$ capacitor C5 are connected to the main ground plane, thereby forming an independent ground filtering path of "$17^{th}$ pin of IC1-capacitor C6-GND".

When a transmission signal of the $16^{th}$ pin of IC1 (such as receiving the user's "switch alarm mode" button signal) or obtaining a local power supply, the medium high frequency interference carried in the signal/power supply (such as 10 KHz-100 KHz noise generated by button contact jitter) will flow through the capacitor C5. Due to the low impedance ($\leq 1.6\Omega$) of the capacitor C5 to this frequency band interference, the interference signal will be quickly filtered out through the "capacitor C5-ground plane" path, and only the pure effective signal/DC voltage will be retained and transmitted to the IC1 to avoid interference that may cause the IC1 to misjudge the signal (such as misidentify button jitter as two operations). If the $17^{th}$ pin of the IC1 is an auxiliary power supply pin, its power supply voltage is easily affected by high-frequency interference (such as when M1 sends a 433.92 MHz signal, the 100 KHz-1 MHz harmonic wave generated is conducted to this pin through the power line). The capacitor C6 exhibits a low impedance ($\leq 0.16\Omega$) to high-frequency interference in this frequency band, and can directly introduce the interference signal into the ground plane, so that the power supply voltage fluctuation of the $17^{th}$ pin of IC1 is controlled within ±5 mV, ensuring the stable operation of the internal signal processing unit (such as RF_DATA signal encoding unit) of IC1.

As shown in FIG. 3, in an embodiment, the vibration unit includes the second controller U1, the RF receiving module, the power transistor Q1, the resistor R2, and the vibration motor MT1. The RF receiving module includes a receiving module M2; a $2^{nd}$ pin of the receiving module M2 is connected to a $1^{st}$ pin of the second controller U1, a $4^{th}$ pin of the receiving module M2 is connected to the antenna, a $1^{st}$ pin of the resistor R2 is connected to a $14^{th}$ pin of the second controller U1, a $2^{nd}$ pin of the resistor R2 is connected to a G electrode of the power transistor Q1, and a D electrode of the power transistor Q1 is connected to the vibration motor MT1.

In an implementation mode, a $2^{nd}$ pin (DOUT, signal output terminal) of the receiving module M2 is directly connected to the $1^{st}$ pin (defined as SIG_RX, RF signal receiving pin) of the second controller U1, without the need for intermediate circuits: after M2 demodulates the RF signal sent by the clock host, it converts the "alarm start/stop command" into a digital level signal (the start command is a high level 3.3V, and the stop command is a low level 0V), which is transmitted to U1 through this path. The $1^{st}$ pin of U1 can directly recognize this level to avoid signal distortion. A $4^{th}$ pin (ANT, antenna interface) of M2 is connected to a 433.92 MHz dedicated PCB built-in antenna (or external whip antenna). If it is a built-in antenna, it is designed to be integrated with a $4^{th}$ pin of M2 through a PCB microstrip line; if it is an external antenna, it can be connected through an IPEX connector to adapt to different housing designs of the vibration unit. A $1^{st}$ pin (VCC) of M2 is connected to a positive electrode of the built-in lithium battery (BAT1) in the vibration unit, and a 3rd pin (GND) of M2 is connected to a negative electrode of the lithium battery and the ground plane of the clock host, ensuring stable power supply to M2. At the same time, a GND of M2 is grounded together with the GND of U1 to avoid signal interference caused by the ground potential difference.

A $1^{st}$ pin of resistor R2 is directly connected to the $14^{th}$ pin of U1 (driving signal output pin), and a $2^{nd}$ pin of the resistor R2 is directly connected to the G electrode of the power transistor Q1. After decoding the RF signal, U1 outputs the driving level through the $14^{th}$ pin (outputting a high level of 3.3V at the beginning of vibration and a low level of 0V at the end), and the resistor R2 limits the signal current to within 3.3 mA ($I=U/R=3.3V/1K\ \Omega$) to avoid excessive current burning the G electrode of the power transistor Q1. A source electrode of the power transistor Q1 is connected to the negative electrode (GND) of the lithium battery, a drain electrode of the power transistor Q1 is directly connected to one end of the vibration motor MT1, and the other end of the vibration motor MT1 is connected to the positive electrode (BAT1+) of the lithium battery, thereby forming a driving circuit of "BAT1+-vibration motor MT1-power transistor Q1 (D-S)-GND". When the G electrode of the power transistor Q1 reaches a high level, the power transistor Q1 conducts, the circuit is energized, and the vibration motor MT1 starts to vibrate. When the G electrode has no high level, the power transistor Q1 is cut off, the circuit is power off, and the vibration motor MT1 stops vibrating.

When the clock host sends an RF signal of 433.92 MHz (alarm start/stop), a $4^{th}$ pin (antenna) of M2 captures the signal and converts it into a digital level signal (DOUT pin output) through an internal superheterodyne demodulation circuit, which is transmitted to the $1^{st}$ pin of U1 through a $2^{nd}$ pin of M2. U1 decodes the received level signal (verifying whether the signal format matches the preset protocol to avoid triggering other 433 MHz interference signals in the environment), confirms that the signal is "alarm start", and enters the driving process. When the confirmation signal is "alarm stop", enter the stop process. Besides that, the $14^{th}$ pin of U1 output at a high level of 3.3V, which is limited by the resistor R2 and transmitted to the G electrode of the power transistor Q1. The Power transistor Q1 conducts, and the power supply circuit of the vibration motor MT1 forms a current (BAT1+-the vibration motor MT1-the power transistor Q1-GND). The vibration motor MT1 starts and continues to vibrate until U1 receives the "alarm stop" signal. When U1 decodes the "alarm stop" signal, the output of the $14^{th}$ pin is switched to a low level of 0V. The G electrode of the power transistor Q1 loses the driving signal and cuts off. The power supply circuit of the vibration motor MT1 is disconnected, and the vibration motor MT1 stops vibrating. U1 controls M2 to enter the periodic wake-up mode (power-saving state).

When the vibration unit has no RF signal reception, U1 outputs a periodic enable signal through its GPIO pin (such as a $2^{nd}$ pin, an EN pin) to control M2 to enter the "8-second cycle, 200 millisecond wake-up" mode: every 8 seconds, M2 is only in the receiving state for 200 milliseconds (consuming 5 mA), and the remaining 7.8 seconds are in the sleeping state (consuming 0.1 μA), thereby significantly reducing the standby power consumption of M2 and extending the service life of the lithium battery.

As shown in FIG. 3, in an embodiment, the vibration motor MT1 is further connected in parallel with a diode D1 and a capacitor C9.

In an implementation mode, the vibration motor MT1 is an inductive load that generates a reverse electromotive force when in power off. Therefore, the diode D1 is connected in reverse parallel, an anode (+) of the diode D1 is connected to a negative electrode of the vibration motor MT1 (i.e., a D electrode of the power transistor Q1), and an cathode (−) of the diode D1 is connected to a positive electrode of the vibration motor MT1 (i.e., the positive electrode of the lithium battery BAT1 built-in the vibration unit), thereby forming a reverse current path of "positive electrode of the vibration motor MT1-cathode of the diode D1-anode of the diode D1-negative electrode of the vibration motor MT1", specifically absorbing a reverse peak voltage when the vibration motor MT1 is powered off. The capacitor C9 is a non-polar capacitor directly connected in parallel to the positive and negative electrodes of the vibration motor MT1. One end of the capacitor C9 is connected to the positive electrode (BAT1+side) of the vibration motor MT1, and the other end thereof is connected to the negative electrode (D electrode side of the power transistor Q1) of the vibration motor MT1, thereby forming a "parallel circuit" with the vibration motor MT1 to filter out high-frequency peak voltages generated during the operation (start, run, stop) of the vibration motor MT1 in real time.

When the vibration motor MT1 continues to vibrate under the driving of the power transistor Q1, the current of its internal coil will generate high-frequency fluctuations with the change of the magnetic field, thereby forming a high-frequency peak voltage of 1 MHz-10 MHz at two ends. At this time, the capacitor C9 exhibits low impedance ($\leq 1\Omega$) to the peak in this frequency band. The peak voltage can be quickly filtered out through a path of "capacitor C9-negative electrode of the vibration motor MT1-GND", stabilizing the voltage at the two ends of the vibration motor MT1 at 3.3V±0.2V, avoiding the peak from being transmitted to the VCC pin of M2 or the power supply pin of U1 through the power supply line, resulting in unstable power supply. When U1 outputs a stop signal and the power transistor Q1 is cut off, the internal coil of the vibration motor MT1 will generate a reverse electromotive force (peak voltage can reach 20-30V) due to sudden interruption of current. If not treated, this reverse voltage will penetrate the power transistor Q1 in the reverse direction through the negative electrode of the vibration motor MT1 (D electrode of the power transistor Q1), or interfere with an RF signal demodulation of M2 and logic judgment of U1 through the power supply line. At this point, the diode D1 conducts in reverse, introducing the reverse peak voltage into a circuit of "diode D1-positive electrode of the vibration motor MT1-BAT1". A low conduction voltage drop (0.5V) of the diode D1 clamps the peak voltage within a safe range ($\leq 0.5$V), thereby avoiding damage to the power transistor Q1, the receiving module M2, and the second controller U1 caused by reverse voltage.

As shown in FIG. 3, in an embodiment, the S electrode of the power transistor Q1 is further connected to a resistor R3.

In an implementation mode, a $1^{st}$ pin of the resistor R3 is directly connected to the G electrode of the power transistor Q1, and this node is also connected to the $2^{nd}$ pin of the resistor R2, forming a signal path of "a $14^{th}$ pin of the second controller U1-the resistor R2-the G electrode of the power transistor Q1-the $1^{st}$ pin of the resistor R3". A $2^{nd}$ pin of R3 is directly connected to the S electrode of the power transistor Q1, and is connected together with the S electrode to the main ground plane (GND) of the vibration unit, ultimately forming a cross grounding pathway for the G-S electrode of "G electrode of the power transistor Q1-the resistor R3-S electrode of the power transistor Q1-GND", rather than S electrode simply being grounded.

When U1 does not output a driving signal (a $14^{th}$ pin is at a low level) and the resistor R2 has no current passing through, the G electrode of the power transistor Q1 is prone to generate a floating voltage due to external interference (such as RF signal harmonic wave received by M2), which may cause the power transistor Q1 to misconduct (NPN transistor conducts when G electrode voltage $\geq 0.7$V). The resistor R3 clamps the potential of the G electrode to a level close to GND ($\leq 0.1$V) through a path of "G electrode-resistor R3-S electrode-GND", ensuring that the power transistor Q1 is in a reliable cut-off state and avoiding the abnormal phenomenon of "no command vibration" in the vibration motor MT1.

When the $14^{th}$ pin of U1 outputs a high-level driving signal (3.3V), it is limited by the resistor R2 (1K $\Omega$) and transmitted to the G electrode of the power transistor Q1. The G electrode voltage rises to a conduction threshold ($\geq 0.7$V), and the power transistor Q1 conducts. A power supply circuit of the vibration motor MT1 (BAT1+-vibration motor MT1-D electrode of the power transistor Q1-S electrode of the power transistor Q1-GND) forms a current. At this time, the resistor R3 is connected in parallel between the G-S electrodes of the power transistor Q1. Due to a small difference between the G electrode voltage (about 0.7V) and the S electrode voltage (close to GND), the resistor R3 only generates a weak current (I=0.7V/10K $\Omega$=0.07 mA), and its impact on the driving current transmitted by the resistor R2 (about 3.3V/1K $\Omega$=3.3 mA) can be ignored, without affecting a normal conduction of the power transistor Q1 and a vibration intensity of the vibration motor MT1.

When the $14^{th}$ pin of U1 turns to a low level, the driving signal disappears, and the voltage at the G electrode of the power transistor Q1 begins to decrease. However, the parasitic capacitance between the G-S electrodes will retain some charge. If not discharged, the residual charge will cause the power transistor Q1 to maintain a "semi conducting" state (i.e., a "false cutoff"), resulting in "lagging" or "weak vibration" of the vibration motor MT1. At this point, a discharge path of the resistor R3 comes into play, thereby quickly releasing the residual charge of parasitic capacitance through "G electrode-resistor R3-S electrode-GND", with a discharge time of $\leq 1$ms, ensuring that the power transistor Q1 is completely cut off immediately after the driving signal disappears, and the vibration motor MT1 synchronously stops vibrating.

In the present disclosure, the various components, their models, and connection relationships that have not been written down have been indicated in the specific circuit diagrams of FIGS. 2 and 3, and will not be repeated here.

The above embodiments are the preferred implementation modes of the present disclosure. Besides that, the present disclosure can also be implemented in other ways, and any obvious replacement is within the protection scope of the present disclosure without departing from the concept of the technical solution.

What is claimed is:

1. A control method for a wireless RF clock oscillator, comprising: a clock host and an independently set vibration unit; the clock host and the vibration unit communicate through a radio frequency, (RF) signal, the vibration unit is powered by an independent battery, wherein the method comprises following steps of:

outputting an alarm start signal, by a first controller, when the first controller in the clock host detects that time has reached a preset alarm time;

receiving the alarm start signal, converting it into an alarm start RF signal, and continuously sending the alarm start RF signal through an antenna for a preset time before stopping, by an RF transmitting module in the clock host;

receiving and demodulating the alarm start RF signal to obtain an alarm start command, and outputting the alarm start command to a second controller in the vibration unit, by an RF receiving module in the vibration unit;

decoding the alarm start command to obtain a start driving signal, by the second controller, and outputting the start driving signal to a power transistor Q1, causing the power transistor Q1 to conduct, and driving the vibration motor MT1 to continuously vibrate;

outputting an alarm stop signal, by the first controller, when the first controller in the clock host detects that an alarm time has ended or receives a manual alarm stop command from a user;

receiving the alarm stop signal, by the RF transmitting module in the clock host, converting the alarm stop signal into an alarm stop RF signal, and continuously sending the alarm stop RF signal through the antenna for the preset time before stopping;

receiving and demodulating the alarm stop RF signal to obtain an alarm stop command, by the RF receiving module in the vibration unit, and outputting the alarm stop command to the second controller in the vibration unit;

decoding the alarm stop command to obtain a stop driving signal, by the second controller, and outputting the stop driving signal to the power transistor Q1, causing the power transistor Q1 to be powered off, and causing a vibration motor MT1 to stop vibrating;

outputting an enable control signal to the RF receiving module, by the first controller, causing the RF receiving module to enter a periodic wake-up mode, when the vibration unit is in a standby mode without receiving an alarm control signal.

2. The control method for a wireless RF clock oscillator according to claim 1, wherein the clock host comprises the first controller IC1, the RF transmitting module, and a crystal oscillator module;

the RF transmitting module and the crystal oscillator module are electrically connected to the first controller IC1.

3. The control method for a wireless RF clock oscillator according to claim 2, wherein the crystal oscillator module comprises a crystal oscillator element Y1, a capacitor C1, and a capacitor C4;

a $1^{st}$ pin of the crystal oscillator element Y1 is connected to the capacitor C1 and a $5^{th}$ pin of the first controller IC1;

a $2^{nd}$ pin of the crystal oscillator element Y1 is connected to the capacitor C4 and a $6^{th}$ pin of the first controller IC1.

4. The control method for a wireless RF clock oscillator according to claim 2, wherein the RF transmitting module comprises a transmitting module M1, wherein a $2^{nd}$ pin of the transmitting module M1 is connected to a $24^{th}$ pin of the first controller IC1, and a $4^{th}$ pin of the transmitting module M1 is connected to the antenna.

5. The control method for a wireless RF clock oscillator according to claim 4, wherein the clock host further comprises a first filtering module, and the first filtering module comprises a capacitor C2 and a capacitor C3, wherein a $1^{st}$ pin of the capacitor C2 and a $1^{st}$ pin of the capacitor C3 are both connected to a $27^{th}$ pin of the first controller IC1;

a $2^{nd}$ pin of the capacitor C2 and a $2^{nd}$ pin of the capacitor C3 are both connected to a $28^{th}$ pin of the first controller IC1 and a $1^{st}$ pin of the transmitting module M1.

6. The control method for a wireless RF clock oscillator according to claim 4, wherein the clock host further comprises a second filtering module, and the second filtering module comprises a resistor R1, a capacitor C7, and a capacitor C8;

one end of the resistor R1 is connected to a power supply, the other end thereof is connected to the capacitor C7 and a $14^{th}$ pin of the first controller IC1;

the capacitor C8 is connected to a $13^{th}$ pin of the first controller IC1.

7. The control method for a wireless RF clock oscillator according to claim 4, wherein the clock host further comprises a third filtering module, and the third filtering module comprises a capacitor C5 and a capacitor C6, wherein a $1^{st}$ pin of the capacitor C5 is connected to a $16^{th}$ pin of the first controller IC1, a $1^{st}$ pin of the capacitor C6 is connected to a $17^{th}$ pin of the first controller IC1;

a $2^{nd}$ pin of the capacitor C5 and a $2^{nd}$ pin of the capacitor C6 are grounded.

8. The control method for a wireless RF clock oscillator according to claim 1, wherein the vibration unit comprises the second controller U1, the RF receiving module, the power transistor Q1, a resistor R2, and the vibration motor MT1;

wherein the RF receiving module comprises a receiving module M2, wherein a $2^{nd}$ pin of the receiving module M2 is connected to a $1^{st}$ pin of the second controller U1, a $4^{th}$ pin of the receiving module M2 is connected to the antenna, a $1^{st}$ pin of the resistor R2 is connected to a $14^{th}$ pin of the second controller U1, a $2^{nd}$ pin of the resistor R2 is connected to a ground electrode of the power transistor Q1, and a drain electrode of the power transistor Q1 is connected to the vibration motor MT1.

9. The control method for a wireless RF clock oscillator according to claim 8, wherein the vibration motor MT1 is further connected in parallel with a diode D1 and a capacitor C9.

10. The control method for a wireless RF clock oscillator according to claim 8, wherein a source electrode of the power transistor Q1 is further connected to a resistor R3.

* * * * *